(12) United States Patent
Watatani et al.

(10) Patent No.: US 9,171,760 B2
(45) Date of Patent: Oct. 27, 2015

(54) METHOD OF MANUFACTURING SEMICONDUCTOR DEVICE

(71) Applicant: Mitsubishi Electric Corporation, Tokyo (JP)

(72) Inventors: Chikara Watatani, Tokyo (JP); Masato Negishi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/322,970

(22) Filed: Jul. 3, 2014

(65) Prior Publication Data

US 2015/0118827 A1  Apr. 30, 2015

(30) Foreign Application Priority Data

Oct. 28, 2013 (JP) .................................. 2013-223174

(51) Int. Cl.
*H01L 21/00* (2006.01)
*H01L 21/78* (2006.01)

(52) U.S. Cl.
CPC ....................................... *H01L 21/78* (2013.01)

(58) Field of Classification Search
CPC .............................. H01S 5/0201; H01S 5/0202
USPC .................................................... 438/33, 462
See application file for complete search history.

(56) References Cited

U.S. PATENT DOCUMENTS

| | | | | |
|---|---|---|---|---|
| 5,629,233 A | * | 5/1997 | Chand et al. | 438/33 |
| 2001/0012307 A1 | * | 8/2001 | Hayakawa | 372/43 |
| 2003/0030053 A1 | * | 2/2003 | Kawakami et al. | 257/72 |
| 2003/0121511 A1 | * | 7/2003 | Hashimura et al. | 125/2 |
| 2007/0205490 A1 | * | 9/2007 | Kusunoki | 257/620 |
| 2009/0137098 A1 | | 5/2009 | Sakamoto et al. | |
| 2012/0187449 A1 | | 7/2012 | Negishi | |

FOREIGN PATENT DOCUMENTS

| | | | |
|---|---|---|---|
| JP | 4-251960 A | | 9/1992 |
| JP | 07131069 A | * | 5/1995 |
| JP | 10125958 A | * | 5/1998 |

(Continued)

OTHER PUBLICATIONS

Taiwanese Patent Office; Office Action in Taiwanese Patent Application No. 10420854950 (Jun. 29, 2015).

*Primary Examiner* — Reema Patel
*Assistant Examiner* — Syed Gheyas
(74) *Attorney, Agent, or Firm* — Leydig, Voit & Mayer, Ltd.

(57) ABSTRACT

A method of manufacturing a semiconductor device includes: forming electrodes on a first major surface of a semiconductor substrate having first and second major surfaces facing in opposite directions; and forming a cleavage-inducing pattern on the first major surface of the semiconductor substrate. The cleavage-inducing pattern extends over a target cleavage position located between the electrodes, has a recess extending over the target cleavage position, and is made of a material different from the material of the semiconductor substrate. The method includes forming a scribed groove in the second major surface of the semiconductor substrate and in a position facing the target cleavage position; and cleaving the semiconductor substrate having the scribed groove and the cleavage-inducing pattern by applying pressure, through a cleaving blade, to the first major surface of the semiconductor substrate.

14 Claims, 7 Drawing Sheets

(56) References Cited

FOREIGN PATENT DOCUMENTS

| JP | 2001-284292 A | 10/2001 |
| JP | 2001-284293 A | 10/2001 |
| JP | 2009-44020 A | 2/2009 |
| JP | 2009-117494 A | 5/2009 |
| JP | 2012-9517 A | 1/2012 |
| JP | 2012-156228 A | 8/2012 |
| TW | 201214541 A | 4/2012 |

* cited by examiner

METHOD OF MANUFACTURING SEMICONDUCTOR DEVICE

BACKGROUND OF THE INVENTION

1. Field of the Invention

The present invention relates to a method of manufacturing a semiconductor device which can perform cleavage at the target cleavage position with high positional accuracy no matter what the accuracy of positional control of the cleaving blade.

2. Background Art

To cleave a semiconductor substrate, a scribed groove is formed in one surface of the semiconductor substrate and cleavage starting from the scribed groove is caused by applying a cleaving blade with pressure to the opposite surface (see, for example, FIG. 1(b) in Japanese Patent Laid-Open No. 2012-9517).

Manufacturing methods for improving the positional accuracy of this cleavage have been proposed. For example, a manufacturing method has been proposed in which an auxiliary groove for cleavage is formed on the semiconductor growth layer side in the vicinity of a target cleavage position (see, for example, Japanese Patent No. 5151400). A manufacturing method has also been proposed in which an opening portion where a particular semiconductor layer and an insulating layer do not exist is formed in a region where a scribed groove is to be formed. This is intended to form a crack extending vertically and linearly from the scribed groove toward the surface opposite from the surface in which the scribed groove is formed (see, for example, Japanese Patent No. 4862965). A manufacturing method has also been proposed in which a semiconductor substrate is etched to form a recess in one surface thereof opposite from the surface in which a scribed groove is formed (see, for example, Japanese Patent Laid-Open No. 2001-284293).

SUMMARY OF THE INVENTION

The conventional technique presuppose that the scribed groove and the cleaving blade are just opposed in position to each other when the cleaving blade is applied with pressure to the surface opposite from the surface in which the scribed groove is formed. However, there is a possibility of occurrence of a misalignment between the positions of the scribed groove and the cleaving blade depending on the amount of wear of the cleaving blade or the accuracy of position control. There is, therefore, a problem that the actual cleavage deviates from the target cleavage position.

In the method of etching a semiconductor substrate so that a recess is formed, the recess is formed close to electrodes of a semiconductor chip. This method has a problem described below. When a high-temperature heat treatment process step for making an ohmic junction between the semiconductor and electrodes is carried out at a final stage of the wafer manufacturing process, the semiconductor substrate exposed in the recess is exposed to the high-temperature environment. For example, if the semiconductor substrate is formed of InP, InP is decomposed in the high-temperature environment and In produced by decomposition is attached to the electrode surfaces by migration, diffusion into the atmosphere, or the like. In attached to the electrode surfaces forms an In oxide in the air, degrading the adhesion between the electrodes and gold wiring bonded to the electrodes. Also, disadvantageously, the additional process step for etching the semiconductor so that the recess is formed is required.

In view of the above-described problems, an object of the present invention is to provide a method of manufacturing a semiconductor device which can perform cleavage at the target cleavage position with high positional accuracy no matter what the accuracy of positional control of the cleaving blade.

According to the present invention, a method of manufacturing a semiconductor device includes: forming a plurality of electrodes on a first major surface of a semiconductor substrate having first and second major surfaces facing in opposite directions; forming a cleavage-inducing pattern on the first major surface of the semiconductor substrate wherein the cleavage-inducing pattern extends over a target cleavage position between the plurality of electrodes, has a recess extending over the target cleavage position, and is made of a material different from a material of the semiconductor substrate; forming a scribed groove in the second major surface of the semiconductor substrate and in such a position as to face the target cleavage position; and cleaving the semiconductor substrate having the scribed groove and the cleavage-inducing pattern by applying a cleaving blade with pressure to the first major surface of the semiconductor substrate.

The present invention makes it possible to perform cleavage at the target cleavage position with high positional accuracy no matter what the accuracy of positional control of the cleaving blade.

Other and further objects, features and advantages of the invention will appear more fully from the following description.

DETAILED DESCRIPTION OF THE PREFERRED EMBODIMENTS

A method of manufacturing a semiconductor device according to the embodiments of the present invention will be described with reference to the drawings. The same components will be denoted by the same symbols, and the repeated description thereof may be omitted.

First Embodiment

Figure 1:
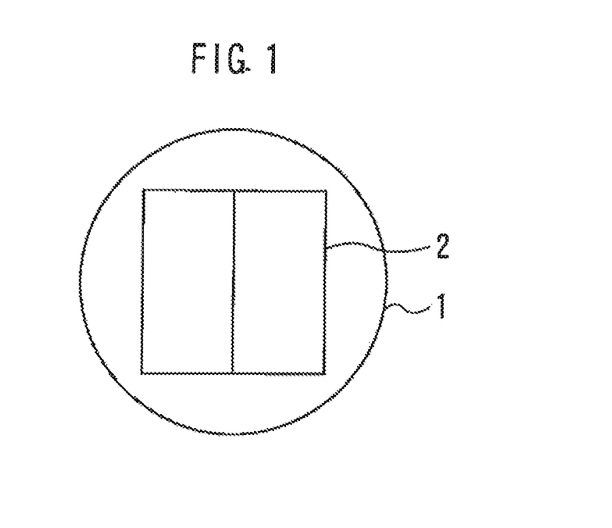
FIGS. 1 and 8 are top views showing a method of manufacturing a semiconductor device according to a first embodiment of the present invention.
Figure 4:
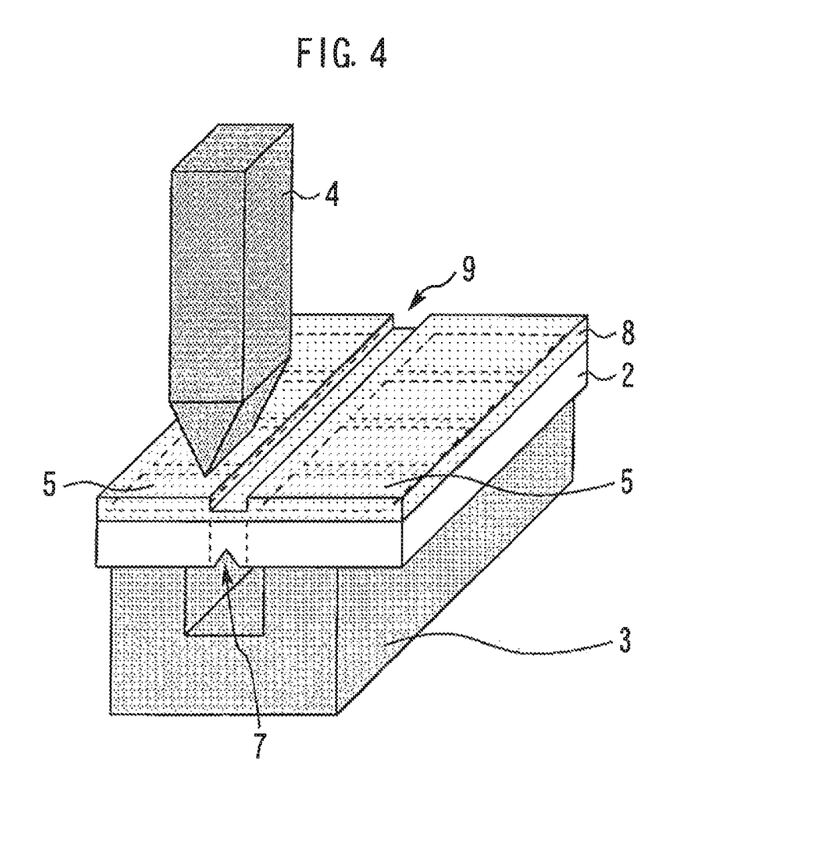
Figure 5:
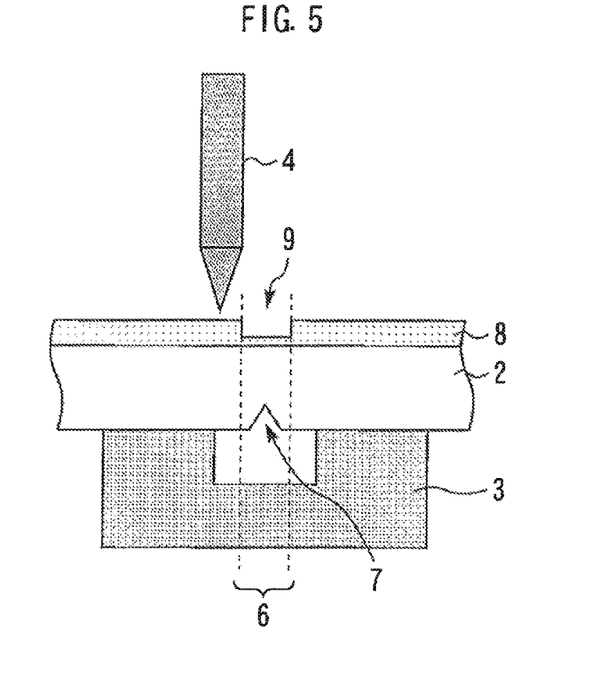
FIGS. 5 and 7 are sectional views showing the manufacturing method.
Figure 7:
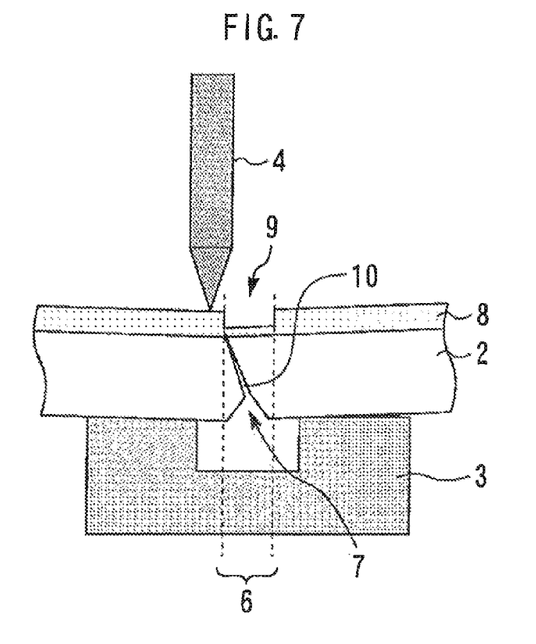
Figure 8:
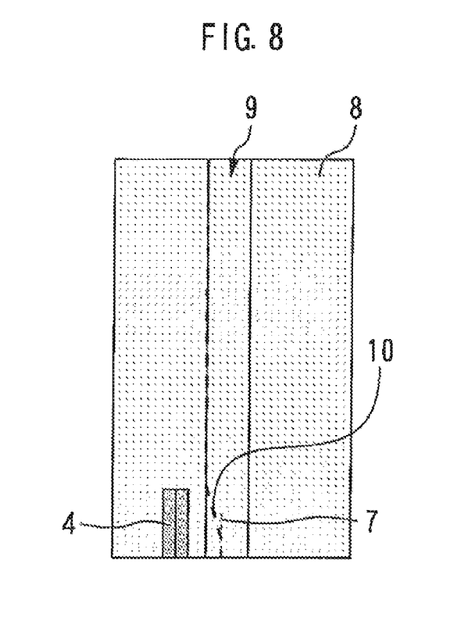

FIGS. 1 and 8 are top views showing a method of manufacturing a semiconductor device according to a first embodiment of the present invention. FIGS. 2 to 4 and 6 are perspective views showing the manufacturing method. FIGS. 5 and 7 are sectional views showing the manufacturing method.

Figure 2:
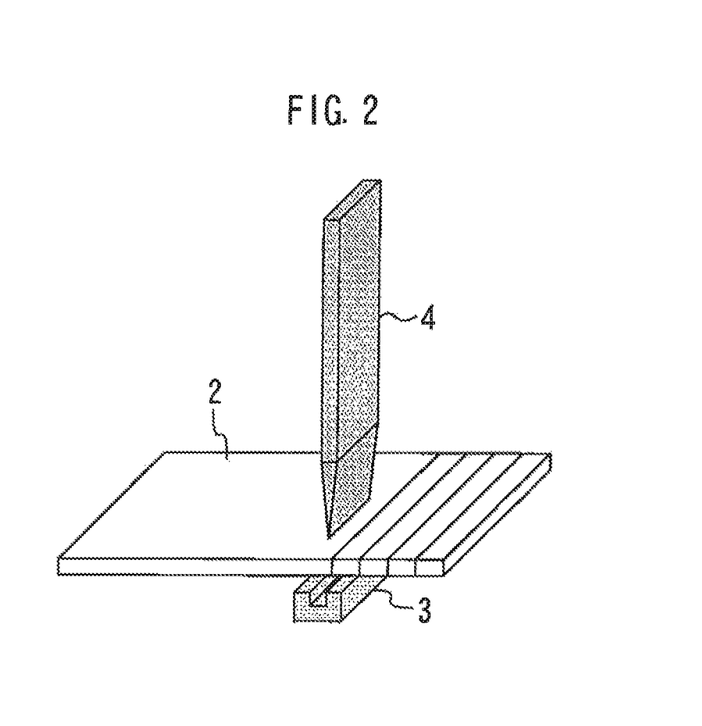
FIGS. 2, 3, 4 and 6 are perspective views showing the manufacturing method.

After semiconductor substrates 2 in block form are formed from a wafer 1 as shown in FIG. 1, each semiconductor substrate 2 in a block state is cleaved into pieces in a bar state by using a receiving die 3 (slit) and a cleaving blade 4, as shown in FIG. 2. The present embodiment is applied to this cleavage from the block state to the bar state. However, the same cleavage effect can also be achieved in the case of application to cleavage from a bar state to a chip state.

In the wafer 1 state, a plurality of electrodes 5 are first formed on a first major surface of each semiconductor substrate 2 having first and second major surfaces facing in opposite directions. The material of the semiconductor substrates 2 is InP or GaAs, for example. Next, a cleavage-inducing pattern layer 8 is formed on the first major surface of each semiconductor substrate 2. Next, the semiconductor substrate 2 and the plurality of electrodes 5 are ohmic functioned to each other by performing a heat treatment while the cleavage-inducing pattern layer 8 extends over target cleavage positions 6. The semiconductor substrates 2 in block form are thereafter formed from the wafer 1.

The cleavage-inducing pattern layer 8 has a recess 9 extending over each target cleavage position 6. The recess 9 has a rectangular shape in section. The cleavage-inducing pattern layer 8 is made of a material different from that of the semiconductor substrate 2. More specifically, the material of the cleavage-inducing pattern layer 8 is any one of an insulating material such as silicon dioxide or silicon nitride, a single metal or an alloy of metals, and a metallic oxide.

Figure 3:
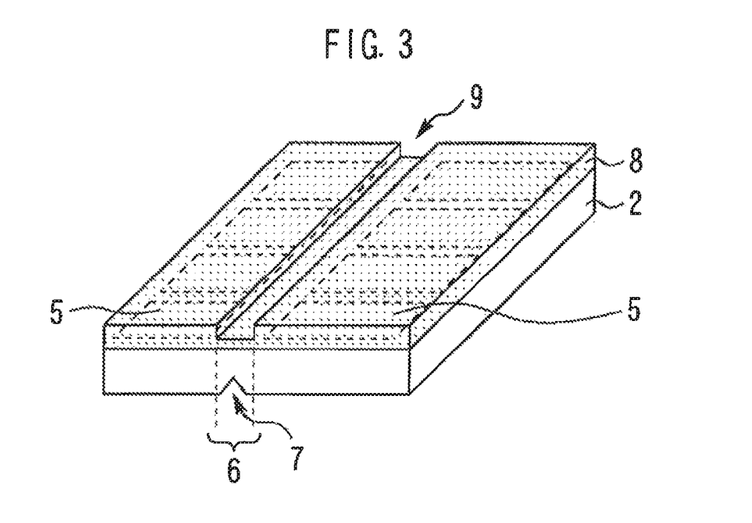

Next, as shown in FIG. 3, scribed grooves 7 are formed in the second major surface of the semiconductor substrate 2, which is opposite from the first major surface. The scribed grooves 7 are formed in such positions as to face the target cleavage positions 6 between the plurality of electrodes 5. As shown in FIGS. 4 and 5, the semiconductor substrate 2 is thereafter placed on the receiving die 3, and the cleaving blade 4 is placed above the semiconductor substrate 2.

Figure 6:
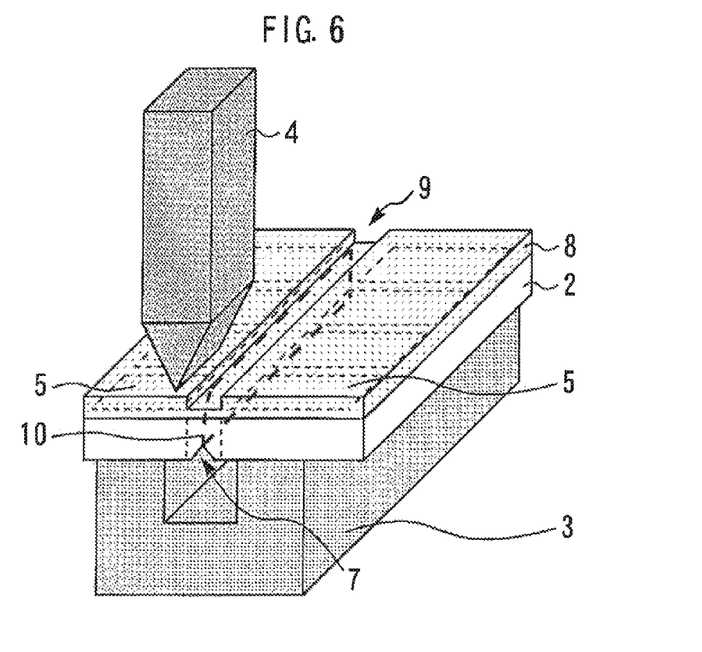

Next, as shown in FIGS. 6 to 8, the semiconductor substrate 2 having the scribed grooves 7 and the cleavage-inducing pattern layer 8 is cleaved by applying the cleaving blade 4 to the cleavage-inducing pattern layer 8 and applying pressure to the cleaving blade and thereby to the first major surface of the semiconductor substrate 2. Since the cleavage-inducing pattern layer 8 having the recess 9 at the target cleavage position 6 present, a bending stress caused by applying pressure to the cleaving blade 4 at a position outside the target cleavage position 6 is maximized at the recess 9. Therefore, a crack 10 extends from the scribed groove 7 toward the recess 9 to form a cleaved surface.

Figure 9:
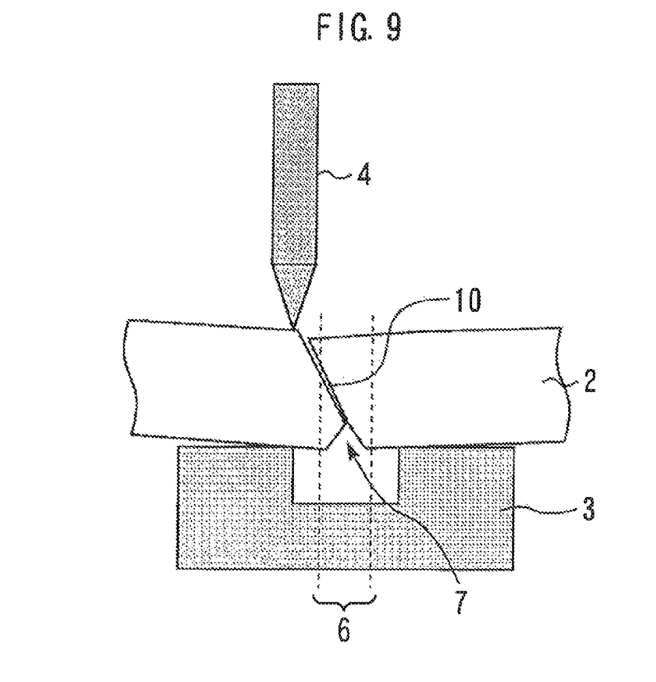
FIG. 9 is a sectional view showing a method of manufacturing a semiconductor device according to a comparative example.
Figure 10:
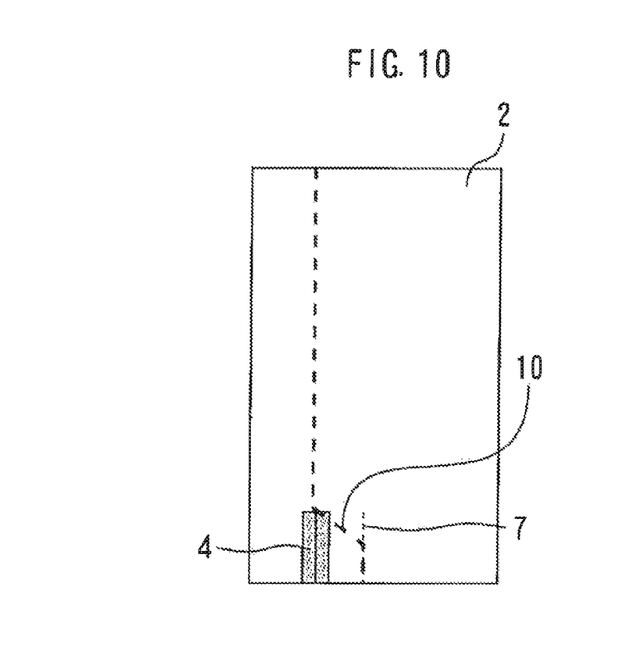
FIG. 10 is a top view showing the manufacturing method.

The effect of the present embodiment will be described in comparison with a comparative example. FIG. 9 is a sectional view showing a method of manufacturing a semiconductor device according to a comparative example, and FIG. 10 is a top view showing the manufacturing method. The cleavage-inducing pattern layer 8 does not exist in the comparative example. Therefore, when a bending moment is caused by applying pressure through the cleaving blade 4 to the semiconductor substrate 2, the bending stress is maximized at the contact position at which the cleaving blade 4 contacts the semiconductor substrate 2 in block form. Accordingly, a crack 10 extends from the scribed groove 7 toward the contact position to form a cleaved surface, and there is a possibility of the cleaved surface deviating from the target cleavage position 6. There is, therefore, a need to accurately control the position of the cleaving blade 4 at the target cleavage position 6.

On the other hand, in the present embodiment, since the cleavage-inducing pattern layer 8 having the recess 9 at the target cleavage position 6 is provided, cleavage at the target cleavage position 6 can be performed with high positional accuracy no matter what the accuracy of positional control of the cleaving blade 4. Moreover, since the cleavage-inducing pattern layer 8 is reduced in thickness at the target cleavage position 6 without forming any opening, damage to the semiconductor substrate 2 which may be caused when the cleaving blade 4 is applied at the target cleavage position 6 can be reduced.

Forming of the recesses 9 in the cleavage-inducing pattern layer 8 can be carried out by working the material forming the cleavage-inducing pattern layer 8 by photolithography and etching. Therefore, there is no need to add a process step for forming the recesses by etching the semiconductor, in contrast with the conventional art.

In the present embodiment, the semiconductor substrate 2 and the plurality of electrodes 5 are ohmic functioned to each other by performing a heat-treatment while the cleavage-inducing pattern layer 8 extends over the target cleavage positions 6. Therefore, the semiconductor substrate 2 is not exposed at the target cleavage positions 6 set close to the electrodes 5, thus preventing a substance constituting the semiconductor substrate 2 from attaching to the surfaces of the electrodes 5 in the heat-treatment process step. For example, if the material of the semiconductor substrate 2 is InP, attachment of In to the electrode surfaces in the heat treatment process step can be prevented. Prevention of degradation of the adhesion between the electrodes 5 and gold wiring bonded to the electrodes 5 is thus achieved. However, it is necessary that the cleavage-inducing pattern layer 8 contain no In.

It is preferred that the material of the cleavage-inducing pattern layer 8 is one of an insulating material such as silicon dioxide or silicon nitride, a single metal or an alloy of metals, and a metallic oxide. Therefore, a material ordinarily used as the material of an insulating film or electrodes in semiconductor devices can also be used as the material of the cleavage-inducing pattern layer 8 so that there is no need to separately prepare the material of the cleavage-inducing pattern layer 8.

It is also preferred that the material of the cleavage-inducing pattern layer 8 have deflective strength or bending strength higher than that of the material of the semiconductor substrate 2. The contribution of the deflective strength of the cleavage-inducing pattern layer 8 is thereby made dominant over that of the semiconductor substrate 2 to ensure that the bending stress can concentrate easily at the recess 9 in the cleavage-inducing pattern layer 8 and cleavage can occur easily at the target cleavage position 6.

Since the sectional shape of the recess 9 in the cleavage-inducing pattern layer 8 is rectangular, the difference between the bending stress at the recess 9 and the bending stress at other portions is large. Therefore, control of the speed at which the cleaving blade 4 is applied and the of the pressure applied to the blade can be performed with facility.

Second Embodiment

Figure 11:
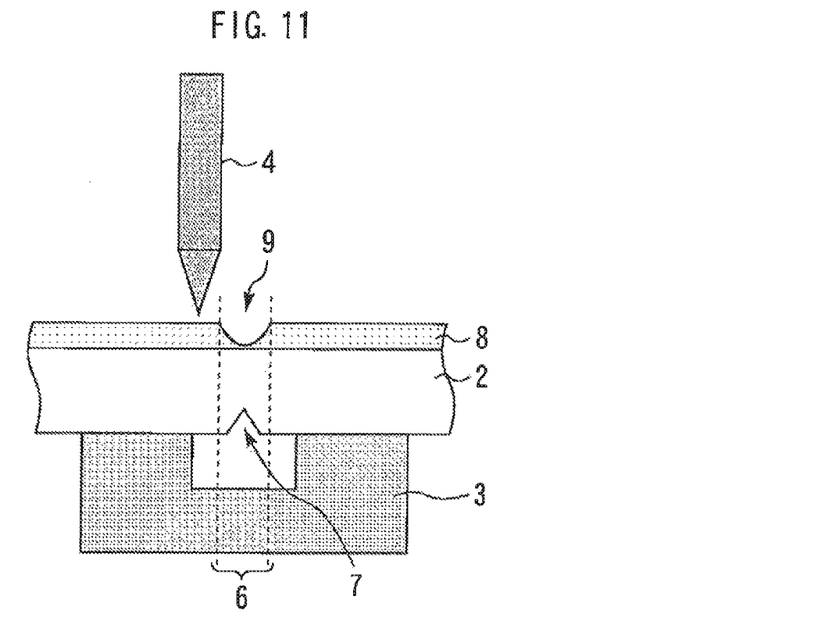
FIGS. 11 and 12 are sectional views showing a method of manufacturing a semiconductor device according to a second embodiment of the present invention.
Figure 12:
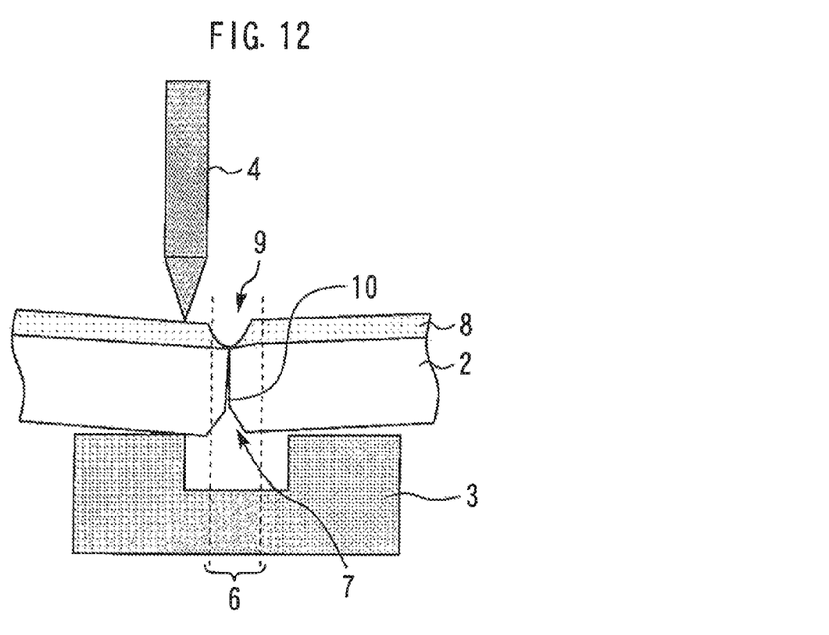

FIGS. 11 and 12 are sectional views showing a method of manufacturing a semiconductor device according to a second embodiment of the present invention. FIG. 11 shows a state before applying the cleaving blade 4 with pressure to the semiconductor substrate 2. FIG. 12 shows a state where the cleaving blade 4 is applied with pressure to the semiconductor substrate 2.

In the present embodiment, the sectional shape of the recess 9 in the cleavage-inducing pattern layer 8 is U-shaped.

The thickness of the semiconductor substrate 2 is minimized at the deepest portion of the U-shaped recess 9. Therefore, bending stress caused by applying the cleaving blade 4 with pressure to a position outside the target cleavage position 6 is maximized at the deepest portion of the recess 9. Accordingly, a crack 10 extends from the scribed groove 7 toward the deepest portion of the recess 9 to form a cleavage surface. As a result, cleavage can be realized with higher positional accuracy with respect to the target cleavage position 6 in comparison with the first embodiment.

Third Embodiment

Figure 13:
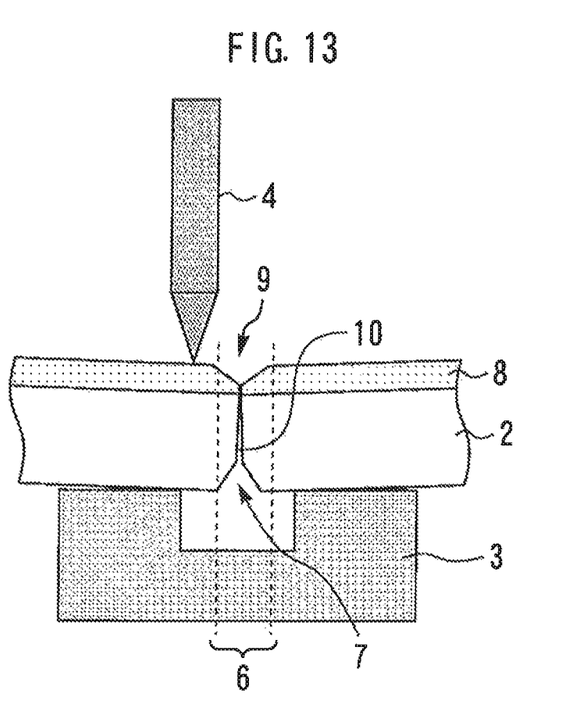
FIG. 13 is a sectional view showing a method of manufacturing a semiconductor device according to a third embodiment of the present invention.

FIG. 13 is a sectional view showing a method of manufacturing a semiconductor device according to a third embodiment of the present invention. In the present invention, the sectional shape of the recess 9 in the cleavage-inducing pattern layer 8 is V-shaped. Also in this case, the same effect as that in the second embodiment can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-223174, filed on Oct. 28, 2013 including specification, claims, drawings and summary, on which the Convention priority of the present application is based, is incorporated herein by reference in its entirety.

What is claimed is:

1. A method of manufacturing a semiconductor device comprising:
   forming a plurality of electrodes on a first major surface of a semiconductor substrate having first and second major surfaces facing in opposite directions, wherein
   the electrodes are spaced apart from each other, and
   the semiconductor substrate is a semiconductor material;
   forming a cleavage-inducing pattern layer on the first major surface of the semiconductor substrate, wherein
   the cleavage-inducing pattern layer covers the first major surface of the semiconductor substrate, the plurality of electrodes, and a target cleavage position on the first major surface of the semiconductor substrate and which is located between the electrodes, and
   the cleavage-inducing pattern layer is a material different from the semiconductor material of the semiconductor substrate;
   forming a recess in the cleavage-inducing pattern layer, wherein the recess extends only partly through the cleavage-inducing pattern layer and faces the target cleavage position on the first major surface of the semiconductor substrate;
   forming a scribed groove in the second major surface of the semiconductor substrate, wherein the scribed groove is located in a position facing the target cleavage position; and
   cleaving the semiconductor substrate having the scribed groove and the cleavage-inducing pattern layer by applying pressure, through a cleaving placed in contact with the cleavage-inducing pattern layer, to the first major surface of the semiconductor substrate.

2. The method of manufacturing a semiconductor device according to claim 1, further comprising, after forming the cleavage-inducing pattern layer and before cleaving the semiconductor substrate, forming ohmic junctions between the semiconductor substrate and the plurality of electrodes by heat treating the semiconductor substrate.

3. The method of manufacturing a semiconductor device according to claim 2, wherein the material of the cleavage-inducing pattern layer is selected from the group consisting of insulating materials, metals, and metallic oxides.

4. The method of manufacturing a semiconductor device according to claim 3, wherein the semiconductor substrate contains In, and the cleavage-inducing pattern layer contains no In.

5. The method of manufacturing a semiconductor device according to claim 1, wherein the material of the cleavage-inducing pattern layer has a deflective strength or a bending strength higher than the semiconductor substrate.

6. The method of manufacturing a semiconductor device according to claim 1, further comprising forming the recess to have a rectangular shape in a cross-section taken transverse to the first and second major surfaces of the semiconductor substrate.

7. The method of manufacturing a semiconductor device according to claim 1, further comprising forming the recess to have a U-shape in a cross-section taken transverse to the first and second major surfaces of the semiconductor substrate.

8. The method of manufacturing a semiconductor device according to claim 1, further comprising forming the recess to have a V-shape in a cross-section taken transverse to the first and second major surfaces of the semiconductor substrate.

9. The method of manufacturing a semiconductor device according to claim 1, wherein the material of the cleavage-inducing pattern layer is selected from the group consisting of insulating materials, metals, and metallic oxides.

10. The method of manufacturing a semiconductor device according to claim 9, wherein the semiconductor substrate contains In, and the cleavage-inducing pattern layer contains no In.

11. The method of manufacturing a semiconductor device according to claim 9, wherein the material of the cleavage-inducing pattern layer has a deflective strength or a bending strength higher than the semiconductor substrate.

12. The method of manufacturing a semiconductor device according to claim 9, further comprising forming the recess to have a rectangular shape in a cross-section taken transverse to the first and second major surfaces of the semiconductor substrate.

13. The method of manufacturing a semiconductor device according to claim 9, further comprising forming the recess to have a U-shape in a cross-section taken transverse to the first and second major surfaces of the semiconductor substrate.

14. The method of manufacturing a semiconductor device according to claim 9, further comprising forming the recess to have a V-shape in a cross-section taken transverse to the first and second major surfaces of the semiconductor substrate.

* * * * *